(12) United States Patent
Toh

(10) Patent No.: US 7,609,127 B2
(45) Date of Patent: Oct. 27, 2009

(54) ELECTRONICALLY CONTROLLABLE RF SWITCH

(75) Inventor: Kong Lim Toh, Singapore (SG)

(73) Assignee: NXP B.V., Eindhoven (NL)

( * ) Notice: Subject to any disclaimer, the term of this patent is extended or adjusted under 35 U.S.C. 154(b) by 73 days.

(21) Appl. No.: 10/550,346

(22) PCT Filed: Mar. 11, 2004

(86) PCT No.: PCT/IB2004/050227

§ 371 (c)(1),
(2), (4) Date: Sep. 23, 2005

(87) PCT Pub. No.: WO2004/086623

PCT Pub. Date: Oct. 7, 2004

(65) Prior Publication Data

US 2006/0208826 A1    Sep. 21, 2006

(30) Foreign Application Priority Data

Mar. 28, 2003  (WO) .................... PCT/SG03/00086

(51) Int. Cl.
*H01P 1/15*    (2006.01)

(52) U.S. Cl. .................... 333/103; 333/262; 327/503
(58) Field of Classification Search ................. 333/101, 333/103, 104, 262; 327/503, 504
See application file for complete search history.

(56) References Cited

U.S. PATENT DOCUMENTS 5,212,408 A * 5/1993 Even-or ..................... 327/493
5,272,457 A * 12/1993 Heckaman et al. .......... 333/262
6,970,056 B2 * 11/2005 Atokawa et al. ............ 333/132

FOREIGN PATENT DOCUMENTS

WO        WO 99/29045        6/1999

* cited by examiner

*Primary Examiner*—Benny Lee

(57) ABSTRACT

An RF switch circuit (10) and a tuner (12) comprising an RF switch circuit are described. The switch circuit comprises at least two input terminals and one output terminal. The input terminals are connected to different RF signal sources, e. g. a terrestrial TV antenna (16) and a TV cable network (18). The circuit comprises first SPST switches (28, 30), each connected to one of the input terminals and a second, SPDT switch (32) connected to the first SPST switches. The switch circuit achieves high isolation performance between the input terminals (20, 22).

20 Claims, 3 Drawing Sheets

ELECTRONICALLY CONTROLLABLE RF SWITCH

Figure 1:
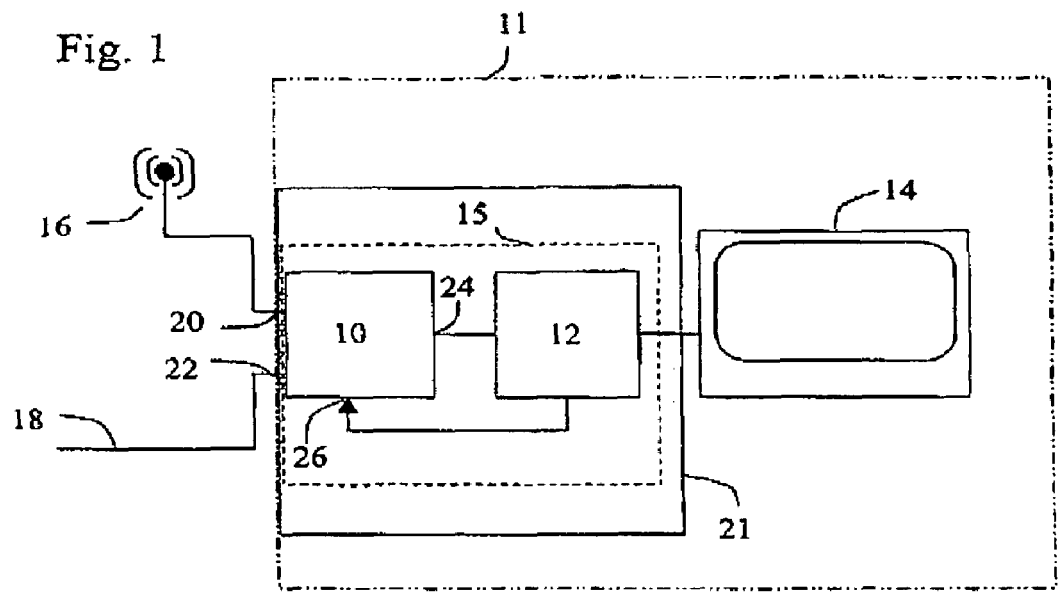

The invention relates to electrical circuits, more particularly to a Radio Frequency (RF) switch circuit and to a receiver circuit for receiving a radio frequency signal.

A receiver circuit serves to receive a RF signal. The RF signal can contain either an analog or a digital signal. The receiver circuit converts the received RF signal to an Intermediate Frequency (IF) signal, and then to a baseband signal. In the case where the received RF signal contains a digital signal, the output is a digital signal, e. g. an MPEG-2 transport stream. In the case where the RF signal contains an analog signal, the output is an analog baseband signal, e. g. an NTSC signal.

A switch circuit serves to connect and disconnect electrical signal paths. For example, several signal sources can be connected to one signal input by a switch circuit. The switch circuit allows to select one of the signal sources and connect it to the signal input.

Especially for RF applications, a switch circuit needs to fulfill certain requirements. One of the requirements would be a low insertion loss (IL) in the forward path. Another would be the isolation performance between not-selected signal sources and the signal input as well as between signal sources.

It is known that commercially available cable Set-Top-Boxes (STB) make use of two or more signal sources, such as for cable and terrestrial TV-signals. In these devices, switching between the two signal sources is achieved by means of electromechanical assemblies which require an electric current to magnetize a coil, which then makes or breaks contact between two contact pins, thereby performing the function of a mechanical switch. Such electromechanical assemblies are bulky and require relatively high current and high voltage to control.

U.S. Pat. No. 5,274,343 discloses a radio frequency circuit for a radar system, connecting several RF signal sources to a single input port of a frequency multiplier circuit. The circuit works as an RF switch circuit with cascading first and second switches, interconnected by a propagation network. First and second switches are SPDT (single pole double throw) integrated FET switches, each comprising one common port and two branch ports. In each of the first switches, one branch port is connected to a termination impedance and the other is connected via a propagation network to a branch port of one of the second switches. The common ports of the second switches are connected to an input port via a network.

It is the object of the present invention to provide a switching circuit and a receiver circuit for electronically switching between at least two signal sources, which circuits are simple in structure and provide good isolation performance.

According to the invention, a switch circuit is provided with at least two input terminals and one output terminal. For RF signals applied to the two input terminals, signal paths are selectively provided to the output terminal. This is achieved by cascading first and second switches.

The first switches comprise a first and a second port. The switches are electronically switchable such that in a first state the first and second ports are connected, whereas in a second state the first and second ports are disconnected. This leads to a high insertion loss in the disconnected state (e.g. more than 40 dB typically) and low insertion loss (e.g. less than 3 dB, typically about 1 dB) in the connected state.

In a preferred embodiment the first switches are implemented using PIN diodes. It is preferred to use two antiparallel PIN diodes in series connection between first and second ports, and a driver terminal connected between the PIN diodes. Also it is preferred for the first switches to be comprised of discrete electronic parts.

According to the invention, there is provided as the second stage of the switch cascade a second switch including two branch ports and a common port. The second switch functions as a single-pole-multi-throw (SPMT) switch, selectively connecting one of the branch ports to the common port. It is preferred to use a switch with only two branch ports, hence a single-pole-double-throw (SPDT) switch. According to a preferred embodiment of the invention, an integrated circuit SPDT or SPMT switch is used for the second switch, e.g. an integrated circuit using FET switches.

According to the invention, in the switch circuit each input terminal is connected to one of the branch ports of the second switch via one of the first switches. Thus, the signal paths are completely electronically switchable. Part count for this circuit is low. In terms of isolation performance, high values can be achieved because of the cascaded structure. For example, if each switching stage provides minimum 35 dB isolation in a relevant frequency range such as from 50 to 500 MHz, the total isolation performance will be a minimum of 70 dB.

According to a preferred embodiment of the invention, a control circuit is provided for the first switches. The control circuit preferably comprises at least two driver circuits, one to provide a control signal and to drive one of the first switches therewith, and the other to provide an inverted control signal and drive another of the first switches therewith. This allows control of both switches with only one control signal, provided at a control terminal. It is preferred for the control circuit to be comprised of discrete electronic parts.

According to a further development of the invention, both first and second switches are controlled simultaneously. Preferably, the above described control circuit is also connected to the second switch, controlling it synchronously to the first switches. This allows for a compact switch circuit already including other circuitry for both switches.

According to a preferred embodiment of the invention, an I2C transceiver is connected to the control circuit. The I2C bus is a simple means of communication and control, for which inexpensive highly integrated components are available.

According to another aspect of the invention, a receiver circuit for receiving a radio frequency signal is provided comprising a switch circuit as described above connected to the input of a tuner circuit. The switch circuit serves to select one out of at least two RF signal sources to connect to the tuner input terminal. For example, the two signal sources could be a terrestrial TV antenna and a cable TV network. The tuner preferably comprises wide band circuitry, able to process the complete frequency range of both signal sources. Due to the excellent isolation performance of the switch circuit, the two signal sources are well isolated from each other. Thus, one tuner can be used for signals from two different sources, electronically switching between the two.

Figure 2:
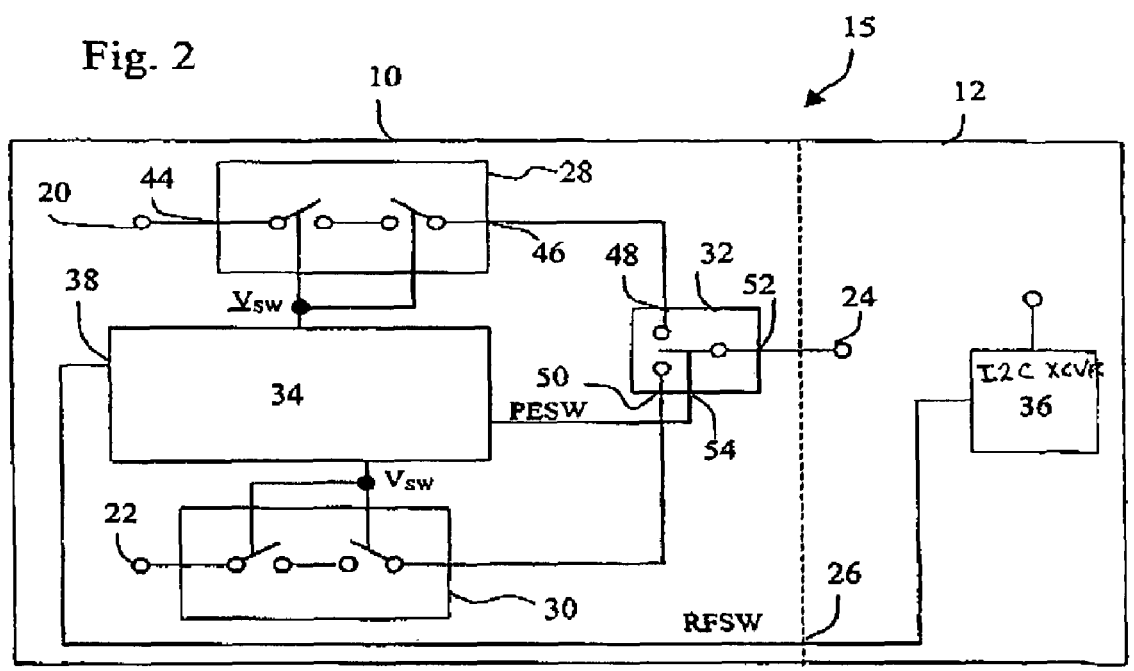
Figure 3:
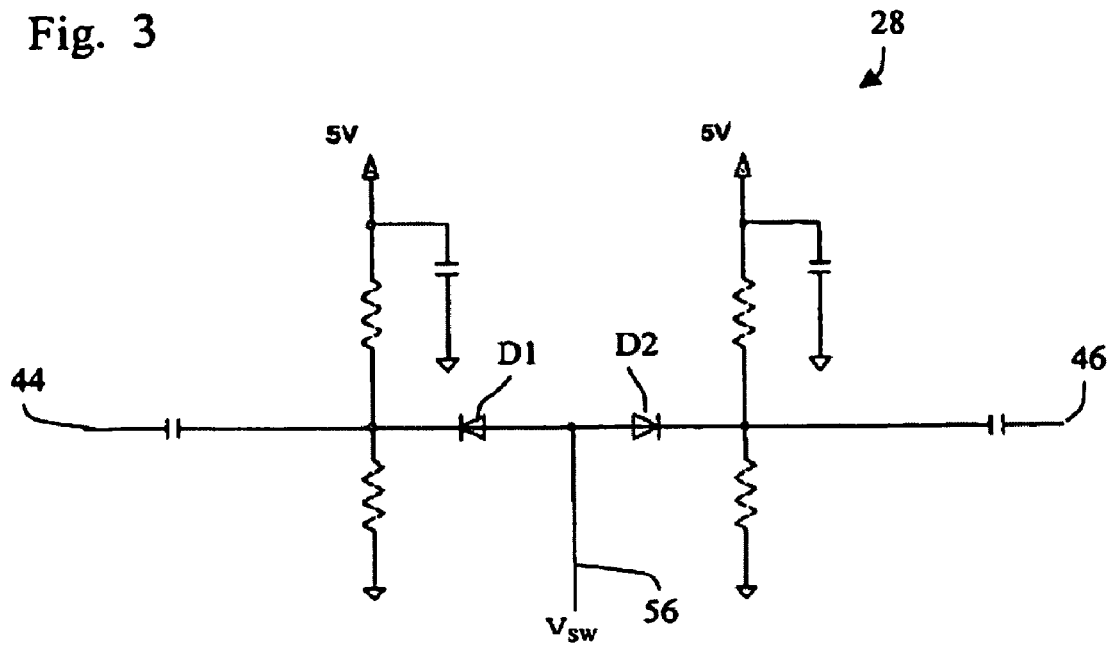
Figure 4:
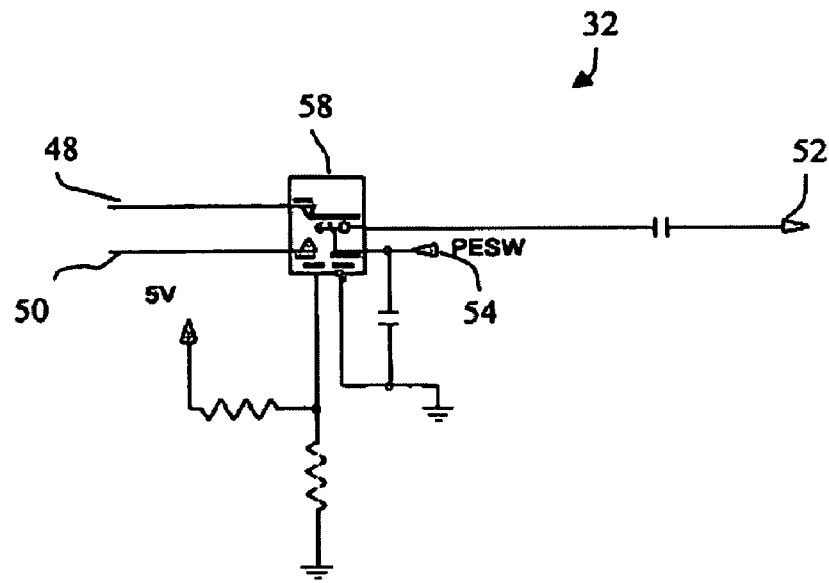
Figure 5:
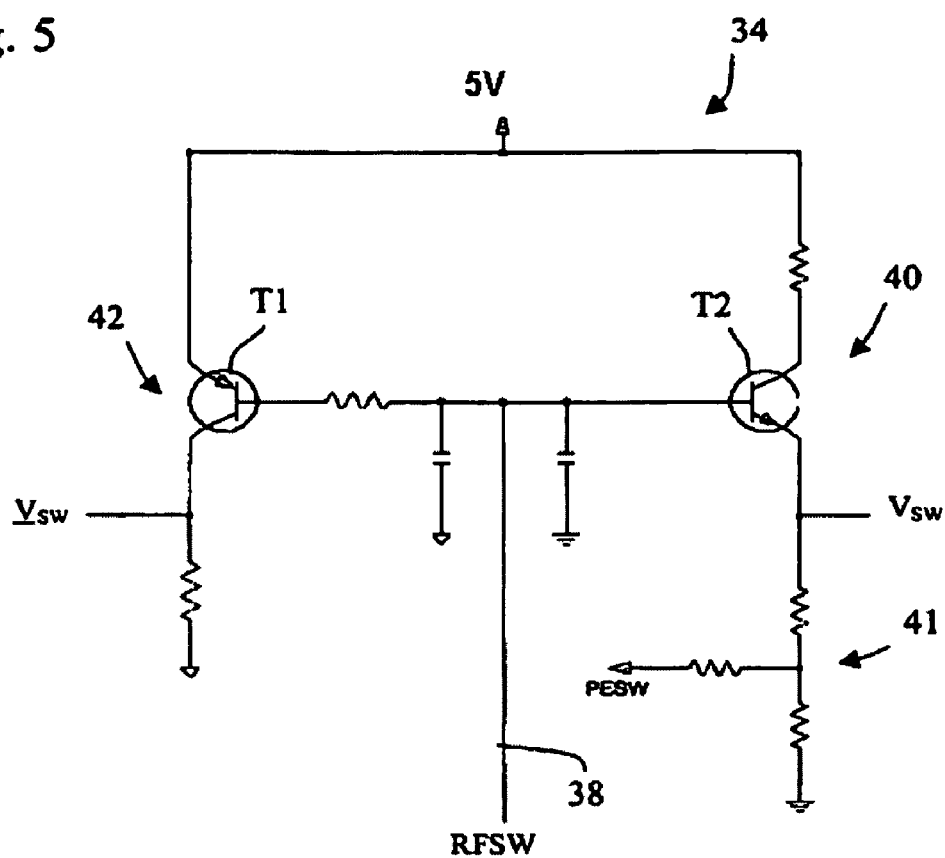

In the following, a preferred embodiment of the invention will be described with reference to the figures. These are:

FIG. 1 a schematic representation of a receiver set connected to a terrestrial TV antenna and a cable TV network;

FIG. 2 a schematic circuit diagram of an RF switch circuit used in FIG. 1;

FIG. 3 a schematic circuit diagram of a first switch used in FIG. 2;

FIG. 4 a schematic circuit diagram of a second switch used in FIG. 2;

FIG. 5 a schematic circuit diagram of a driver circuit used in FIG. 2.

Shown in FIG. 1, there is a receiver set 11 comprising a TV device 14 and a Set-Top-Box 21. It should be noted that receiver set 11 serves here as an example only. TV device 14 can be any visual display, e. g. in the form of a LCD-, Plasma- or Cathode Ray display. Also, receiver set 11 can be a computer system where there is a TV card installed instead of Set-Top-Box 21 and there is a computer monitor instead of TV device 14. Also as a further alternative, the functions of Set-Top-Box 21 can be integrated in a TV device.

Set-Top-Box 21 comprises a receiver module 15 for receiving High Frequency (HF) signals and converting them to baseband signals.

In the example of FIG. 1, receiver module 15 and Set-Top-Box 21 are hybrid digital/analog TV devices, i. e. they can receive HF signals containing both analog and digital signals.

Receiver module 15 comprises a tuner 12. The tuner first translates an RF signal received at its input into an Intermediate Frequency (IF) signal. Further circuitry (not shown) then demodulates the IF signal to output an analog video signal (Composite Video Baseband Signal) and a TV audio signal. The same tuner 12 may also contain additional circuits such as IF amplifiers, SAW filters, VSB/QAM demodulator, etc., which is capable of demodulating both terrestrial and cable Digital TV signal and outputting an MPEG-2 Transport Stream.

In the arrangement of FIG. 1 there are two high frequency TV signal sources: a terrestrial TV antenna 16 and a TV cable network 18. The antenna 16 is connected to a first input port 20 of receiver set 11. The TV cable network 18 is connected to a second input port 22 of receiver set 11. In Set-Top-Box 21 of receiver set 11 the receiver module 15 is arranged in a way such that HF inputs 20, 22 of receiver set 11, are indeed input ports of receiver module 15. Receiver module 15 comprises a switch circuit 10 connected to input ports 20, 22. An output port 24 of switch circuit 10 is connected to the input of tuner 12. Switch 10 serves to connect either the signal from antenna 16 or the signal from cable network 18 to the tuner 12. Switch circuit 10 can be electronically controlled by tuner 12 via a control interface port 26.

The two RF signal sources 16, 18 need to be electrically isolated one from the other. The electrical isolation required is demanded by regulations, such as the FCC part 15.115 and 15.117. Here, an isolation performance of 80 dB between 54 and 216 MHz, 60 dB between 216 and 550 MHz and 55 dB between 550 and 806 MHz are specified.

It should be noted that the arrangement of switch circuit 10 and tuner 12 shown in FIG. 1 in a symbolic representation to illustrate the function of the switch circuit 10. In real applications, switch circuit 10 and tuner 12 are preferably part of the same device, such as the receiver module 15.

It should be noted that tuner 12 is known per se to the skilled person and therefore is not shown and explained here in detail. Tuner circuit 12 receives a HF signal at terminal 24. FIG. 2 shows a schematic of receiver module 15 with switch circuit 10 and tuner 12.

Switch circuit 10 comprises two single-pole-single-throw (SPST) switches 28, 30, one single-pole-double-throw (SPDT) switch 32, a control circuit 34 and a drive voltage input 26.

An I²C transceiver circuit 36 is implemented in the tuner 12. I²C transceiver 36 provides a voltage to voltage input 26 to control the switch circuit 10. Transceiver 36 receives commands via an I²C bus and controls switch 10 accordingly, switching between a first state, where a signal path is established from first input terminal 20 to output terminal 24 and a second state where a signal path is provided from second input terminal 22 to output terminal 24.

I²C transceiver 36 provides a voltage signal RFSW, which is fed into control circuit 34. Control circuit 34 is a complementary driver circuit producing an in-phase voltage $V_{SW}$ to drive second SPST switch 30 and an inverted voltage $\underline{V}_{SW}$ to drive first SPST switch 28. Control circuit 34 further provides a driver for switch signal PESW to drive the SPDT switch 32.

Control circuit 34 receives at a control terminal 38 voltage RFSW as a switch signal. Voltage RFSW can be either Hi, e.g. 5 V, or Lo, e.g. 0 V.

First and second SPST switches 28, 30 are of the same structure. They each comprise two switching elements, driven by voltages $V_{SW}$ and $\underline{V}_{SW}$, respectively, at a driver terminal. If the signal applied to the driver terminal is Hi, the two switching elements are switched on, so that first and second ports 44, 46 are connected. If the signal applied is Lo, then the switching elements are off, disconnecting first and second ports 44, 46.

SPDT switch 32 comprises two branch ports 48, 50, a common port 52 and a control port 54. The two common ports 48, 50 are each connected to a second port of a corresponding one of the SPST switches 28, 30. The common port 52 is connected to output terminal 24 of switch circuit 10.

SPDT switch 32 selectively connects one of the branch ports 48, 50 to common port 52, depending on a driver signal at driver port 54. If the driver signal is Hi, first branch port 48 is connected to common port 52. If the driver signal is Lo, second branch port 50 is connected to common port 52.

Control circuit 10 operates in the following way: According to a signal on its I2C input port, transceiver 36 provides a switching signal RFSW either Hi or Lo to control circuit 10.

If RFSW is Hi, this corresponds to a first state where first SPST 28 is on, connecting first input port 20 to first branch point 48 of SPDT switch 32. At the same time, SPDT switch 32 is controlled by signal PESW set to Hi to connect first branch port 48 to common port 52, such that a signal path is provided between first input terminal 20 and output terminal 24 of switch 10. This signal path has low insertion loss. At the same time, second SPST switch 30 is off and also second branch port 50 of SPDT switch 32 is unconnected. Thus, there is high isolation between input terminal 20, 22 and between second input terminal 22 and output terminal 24.

If transceiver 36 receives the opposite I2C command, it controls switch 10 to switch to a second state, where the situation is reversed. RFSW is Lo, $V_{SW}$ is Lo, first SPST switch 28 is off, $\underline{V}_{SW}$ is Hi, second SPST switch 30 is on, PESW is Lo, SPDT switch 32 connects second branch port 50 to common port 52, whereas first branch port 48 is unconnected. This leads to a signal path with low insertion loss between second input terminal 22 and output terminal 24, while the input terminals 20, 22 are well insulated one from the other and also first input terminal 20 is well insulated from output terminal 24.

In FIG. 3, there is shown a circuit diagram of SPST switch 28. Both SPST switches 28, 30 are of identical structure. They are implemented using discrete electronic parts. PIN diodes D1, D2 serve as switching elements. For example, the PIN diodes of the types HVC142 family available from Hitachi or parts with similar PIN diode characteristics, such as low switched-on capacitance, can be used. The diodes D1, D2 are connected in anti-parallel fashion in series connection between input port 44 and output port 46. At each port 44, 46, there is provided a voltage divider between supply voltage (5 V) and ground, establishing a fixed DC potential. Between the diode D1, D2, a driver terminal 56 is connected where voltage $V_{SW}$ is applied. If $V_{SW}$ is Hi (e.g. 5 V), both diodes D1, D2 become forward biased, so that a signal path with low insertion loss is provided between input port 44 and output port 46.

If $V_{SW}$ is Lo (e.g. 0 V), on the other hand, diodes D1, D2 are reversed biased, so that a high isolation of about 40 dB is achieved between input port 44 and output port 46. In FIG. 3 (and in succeeding FIGS. 4 and 5), a positive supply voltage 5V_SW is used.

In FIG. 4, there is shown an implementation of SPDT switch 32 of FIG. 2. Like reference labels in FIG. 4 refer to the same features described in FIG. 2. SPDT switch 32 is implemented using an integrated circuit RF SPDT switch 58. This is preferably a MOSFET switch. For example, a PE4230 available from Peregrine Semiconductor Corp., can be used. This integrated circuit features high RF isolation (38 dB at 1.0 GHz) and low insertion loss (0.44 dB at 1.0 GHz) and makes use of low voltage CMOS logic control.

FIG. 5 shows a schematic of the control circuit 34. Control circuit 34 is implemented using discrete electronic parts. From the switch signal RFSW an in phase voltage signal $V_{SW}$ generated by a first driver circuit 40, and an inverted voltage signal $\underline{V}_{SW}$ is generated by a second driver circuit 42. A resistive divider network 41 is used to obtain voltage PESW from $V_{SW}$. Driver circuits 40, 42 are implemented by bipolar transistors T1, T2 of type BC 8 57 BW and BC 847 BW connected in a complementary circuit.

When RFSW is applied to the base of the complementary transistor pair 40, 42, a in-phase voltage $V_{SW}$ is obtained from driver transistor 40 and an inverted voltage $\underline{V}_{SW}$ is obtained from driver transistor 42. PESW is an adaptation of the in-phase voltage $V_{SW}$ to obtain a correct switching voltage for the SPDT switch 32.

As shown in FIG. 1, switch circuit 10 is integrated in receiver module 15, which can be the receiver module of a Set-Top-Box 21, a PC-TV-card or an integrated receiver module of a TV set. Output port 24 of switch circuit 10 is connected to the input port of tuner 12. The two input terminals 20, 22 of switch circuit 10 are connected to RF signal sources as shown in FIG. 1.

According to control signals received via I2C bus, transceiver 36 integrated in tuner 12 controls switch 10 to selectively either connect the first signal source (e. g. terrestrial antenna 16 of FIG. 1) or the second signal source (e. g. cable TV signal 18 of FIG. 1) to the RF input of tuner 12.

Tuner 12 receives the selected RF signal and converts it to a IF signal. Tuner 12 is a hybrid module capable of receiving both analog and digital terrestrial as well as cable signals. Depending on whether the received RF signal contains a digital or analog TV signal, the IF signal generated is either demodulated to output a baseband analog signal or is processed to output a digital baseband signal in the form of an MPEG-2 transport stream.

The invention claimed is:

1. A switch circuit comprising:
at least two input terminals and one output terminal,
first switches, each first switch comprising a first and second port, each first switch being electronically switchable between a first state, wherein the first port is disconnected from the second port, and a second state, wherein the first port is connected to the second port, wherein each of the input terminals is connected to a first port of a respective one of said first switches, and
a second switch with at least two branch ports and a common port coupled to said output terminal, said second switch electronically switchable between different states, wherein in each state a respective branch port of the at least two branch ports is connected to the common port and the remainder of the at least two branch ports are disconnected from the common port, wherein each of the branch ports is connected to a second port of a corresponding one of said first switches;
wherein the first switches are configured so that all of the first switches are not in the first state simultaneously, wherein one of the at least two input terminals is connected to a terrestrial TV antenna and another of the at least two input terminals is connected to a TV cable network, wherein one of the first switches receives a first TV signal from the terrestrial TV antenna and another of the first switches receives a second TV signal from the TV cable network.

2. Circuit according to claim 1, wherein the first switches are implemented using PIN diodes.

3. Circuit according to claim 1, wherein the first switches are implemented using two anti-parallel PIN-diodes in series connection between the respective first and second ports, and wherein a driver terminal is connected between the diodes.

4. Circuit according to claim 1, wherein the first switches are comprised of discrete electronic parts.

5. Circuit according to claim 1, wherein the second switch is an integrated circuit.

6. Circuit according to claim 1, wherein a control circuit is provided to synchronously control said first switches and said second switch.

7. Circuit according to claim 6, wherein the control circuit comprises a control terminal, a first driver circuit, and a second driver circuit, wherein the first driver circuit provides a first voltage signal to drive one of the first switches, wherein the second driver circuit provides a second voltage signal to drive another of the first switches, wherein the first voltage signal is an inversion of the second voltage signal, the first voltage signal and the second voltage signal being generated from a voltage signal provided at the control terminal.

8. Circuit according to claim 7, wherein the control circuit further comprises a resistive divider network coupled to the first driver circuit, the resistive divider network being configured to obtain a third voltage signal from the first voltage signal and to control the second switch using the third voltage signal.

9. Circuit according to claim 6, wherein the control circuit is connected to an I$^2$C transceiver.

10. A receiver circuit for receiving a radio frequency signal, the receiver circuit comprising:
at least two radio frequency input terminals;
a tuner circuit for receiving radio frequency signals at an input, and for generating baseband signals; and
a switch circuit comprising:
at least two input terminals and one output terminal,
first switches, each first switch comprising a first and second port, each first switch being electronically switchable between a first state, wherein the first port is disconnected from the second port , and a second state, wherein the first port is connected to the second port , wherein each of the input terminals is connected to a first port of a respective one of said first switches, and
a second switch with at least two branch ports and a common port coupled to said output terminal, said second switch electronically switchable between different states, wherein in each state a respective branch port of the at least two branch ports is connected to the common port and the remainder of the at least two branch ports are disconnected from the common port, wherein each of the branch ports is connected to a second port of a corresponding one of said first switches, wherein the input terminals are connected to the radio frequency input terminals and the output terminal is connected to the input of the tuner, wherein the first switches are configured so that all of the first switches are not in the first state simultaneously, wherein one of the at least two radio frequency input terminals is connected to a terrestrial TV antenna and another of the at least two radio frequency input terminals is connected to a TV cable network, wherein one of the first switches receives a first TV signal from the terrestrial TV antenna and another of the first switches receives a second TV signal from the TV cable network.

11. The receiver circuit of claim 10, wherein the first switches are implemented using PIN diodes.

12. The receiver circuit of claim 11, wherein the first switches are implemented using two anti-parallel PIN-diodes in series connection between the respective first and second ports, and wherein a driver terminal is connected between the diodes.

13. A receiver set comprising a set top box and a TV device coupled to the set top box, wherein the set top box includes the receiver circuit of claim 10.

14. A computer system comprising a TV card and a computer monitor coupled to the TV card, wherein the TV card includes the receiver circuit of claim 10.

15. The receiver circuit of claim 10, wherein a control circuit is provided to synchronously control said first switches and said second switch.

16. The receiver circuit of claim 15, wherein the control circuit comprises a control terminal, a first driver circuit, and a second driver circuit, wherein the first driver circuit provides a first voltage signal to drive one of the first switches, wherein the second driver circuit provides a second voltage signal to drive another of the first switches, wherein the first voltage signal is an inversion of the second voltage signal, the first voltage signal and the second voltage signal being generated from a voltage signal provided at the control terminal.

17. The receiver circuit of claim 16, wherein the control circuit further comprises a resistive divider network coupled to the first driver circuit, the resistive divider network being configured to obtain a third voltage signal from the first voltage signal and to control the second switch using the third voltage signal.

18. The receiver circuit of claim 10, wherein the tuner circuit includes an $I^2C$ transceiver configured to receive commands via an $I^2C$ bus and to use the commands to control the switch circuit.

19. A switch circuit comprising:
at least two input terminals and one output terminal,
first switches, each first switch comprising a first and second port, each first switch being electronically switchable between a first state, wherein the first port is disconnected from the second port, and a second state, wherein the first port is connected to the second port, wherein each of the input terminals is connected to a first port of a respective one of said first switches, and
a second switch with at least two branch ports and a common port coupled to said output terminal, said second switch electronically switchable between different states, wherein in each state a respective branch port of the at least two branch ports is connected to the common port and the remainder of the at least two branch ports are disconnected from the common port, wherein each of the branch ports is connected to a second port of a corresponding one of said first switches;
wherein the first switches are configured so that all of the first switches are not in the first state simultaneously, wherein a control circuit is provided to synchronously control said first switches and said second switch, wherein the control circuit comprises a control terminal, a first driver circuit, and a second driver circuit, wherein the first driver circuit provides a first voltage signal to drive one of the first switches, wherein the second driver circuit provides a second voltage signal to drive another of the first switches, wherein the first voltage signal is an inversion of the second voltage signal, the first voltage signal and the second voltage signal being generated from a voltage signal provided at the control terminal, wherein the control circuit further comprises a resistive divider network coupled to the first driver circuit, the resistive divider network being configured to obtain a third voltage signal from the first voltage signal and to control the second switch using the third voltage signal.

20. Circuit according to claim 19, wherein the first switches are implemented using PIN diodes.

* * * * *